(12) United States Patent
Zhao et al.

(10) Patent No.: US 10,320,337 B2
(45) Date of Patent: Jun. 11, 2019

(54) FULLY-DIFFERENTIAL OPERATIONAL AMPLIFIER SYSTEM

(71) Applicant: Cirrus Logic International Semiconductor Ltd., Edinburgh (GB)

(72) Inventors: Xin Zhao, Austin, TX (US); Tejasvi Das, Austin, TX (US); Hossein Mirzaie, Austin, TX (US); Lei Zhu, Austin, TX (US); Xiaofan Fei, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 14 days.

(21) Appl. No.: 15/418,405

(22) Filed: Jan. 27, 2017

(65) Prior Publication Data

US 2018/0062583 A1    Mar. 1, 2018

Related U.S. Application Data

(60) Provisional application No. 62/381,209, filed on Aug. 30, 2016.

(51) Int. Cl.
| | |
|---|---|
| H03F 3/217 | (2006.01) |
| H03F 1/26 | (2006.01) |
| H03F 3/187 | (2006.01) |
| H03F 3/45 | (2006.01) |

(52) U.S. Cl.
CPC .............. *H03F 1/26* (2013.01); *H03F 3/187* (2013.01); *H03F 3/2173* (2013.01); *H03F 3/45475* (2013.01); *H03F 3/45928* (2013.01); *H03F 2200/03* (2013.01); *H03F 2203/45138* (2013.01); *H03F 2203/45438* (2013.01); *H03F 2203/45512* (2013.01)

(58) Field of Classification Search
CPC .......... H03F 1/26; H03F 3/183; H03F 3/2173; H03F 3/45071; H03F 3/217; H03F 3/2171; H03F 2200/432; H03F 3/38; H03F 2200/351; H03F 1/04; H03F 1/34; H03F 2200/07; H03M 1/504; H03M 1/822; H04L 25/4902
USPC ............................. 330/10, 251, 207 A, 258
See application file for complete search history.

(56) References Cited

U.S. PATENT DOCUMENTS

| | | |
|---|---|---|
| 3,761,831 A | 9/1973 | Foerster |
| 4,555,673 A | 11/1985 | Huijsing et al. |
| 4,933,644 A | 6/1990 | Fattaruso et al. |

(Continued)

FOREIGN PATENT DOCUMENTS

| | | |
|---|---|---|
| EP | 1096671 A1 | 5/2001 |
| EP | 2466745 A1 | 6/2012 |

*Primary Examiner* — Khanh V Nguyen
(74) *Attorney, Agent, or Firm* — Norton Rose Fulbright US LLP

(57) ABSTRACT

A dynamic common reference input (CMRI) signal may be provided to an operational amplifier, or "op-amp," in an amplifier system to reduce the common mode ripple of the fully-differential op-amp, while adding little or no noise in the amplifier system. The dynamic CMRI signal may be controlled such that a common-mode component of two amplifier input nodes of the operational amplifier is made approximately independent of two input signals received at two system input nodes of the amplifier system. An amplifier system with the dynamic CMRI may be used in class-D amplifiers, such as amplifiers for audio systems that generate output for headphones or speakers.

29 Claims, 8 Drawing Sheets

(56) References Cited

U.S. PATENT DOCUMENTS

| | | | |
|---|---|---|---|
| 5,613,233 A * | 3/1997 | Vagher | H03D 7/1433 330/258 |
| 6,417,728 B1 * | 7/2002 | Baschirotto | H03F 3/45183 330/258 |
| 6,590,436 B2 | 7/2003 | Jordanger et al. | |
| 6,603,356 B1 | 8/2003 | Kim et al. | |
| 6,774,722 B2 * | 8/2004 | Hogervorst | H03F 1/086 330/258 |
| 6,985,021 B1 | 1/2006 | Zaliznyak et al. | |
| 7,009,541 B1 | 3/2006 | Nguyen | |
| 7,233,203 B2 * | 6/2007 | Huang | H03F 3/45475 330/258 |
| 7,365,600 B1 | 4/2008 | Lokere | |
| 7,463,089 B1 | 12/2008 | Bapat et al. | |
| 7,705,671 B1 * | 4/2010 | Bapat | H03F 3/45475 330/10 |
| 7,724,043 B1 | 5/2010 | LeBoeuf, II et al. | |
| 7,893,766 B1 * | 2/2011 | Cranford, Jr. | H03F 1/3211 330/258 |
| 8,552,801 B2 * | 10/2013 | Myles | H03F 1/0205 330/258 |
| 9,264,002 B2 | 2/2016 | Ni et al. | |
| 9,479,120 B2 * | 10/2016 | Cho | H03F 1/083 |
| 2006/0103426 A1 | 5/2006 | Lee et al. | |
| 2008/0303590 A1 | 12/2008 | Wu et al. | |
| 2012/0126897 A1 * | 5/2012 | Lin | H03F 3/45183 330/259 |
| 2014/0300415 A1 | 10/2014 | Casiraghi et al. | |

* cited by examiner

FULLY-DIFFERENTIAL OPERATIONAL AMPLIFIER SYSTEM

CROSS-REFERENCE TO RELATED PATENT APPLICATIONS

This application claims the benefit of priority of U.S. Provisional Patent Application No. 62/381,209 to Xin Zhao et al. filed Aug. 30, 2016 and entitled "Fully Differential Operational Amplifier Input Common Mode Control Technique," which is incorporated herein by reference.

FIELD OF THE DISCLOSURE

The instant disclosure relates to electronic devices. More specifically, portions of this disclosure relate to operational amplifiers.

BACKGROUND

Fully-differential amplifiers suitable for use as operational amplifiers ("op-amps") are one of the main building blocks in analog circuit design. Op-amps are used in many applications, such as analog-to-digital converters (ADCs), digital-to-analog converters (DACs), voltage reference generators, and sample-and-hold circuits. One example op-amp configuration from the prior art is shown in FIG. 1. Input signals 102 and 104 to op-amp 101 and output signals 106 and 108 from op-amp 101 may each include both a differential and a common mode (CM) signal. Op-amp 101 has a closed-loop structure, such that output signals 106 and 108 are related to the input signals 102 and 104. The common-mode (CM) voltage of the output signals 106 and 108 are set by a constant reference voltage $V_{CM\_ref}$ applied as a common mode reference input signal 110. A common-mode variation at the input signals 102 and 104 is replicated as the common-mode input of the op-amp 101. This variation can degrade the performance in some applications, such as by reducing linearity of the op-amp 101. Some conventional solutions to this variation are described with reference to FIG. 2 and FIG. 3.

FIG. 2 is a circuit in accordance with prior art U.S. Pat. No. 6,603,356. The fully differential op-amp 101 of FIG. 1 is substituted with two differential-input single-ended output op-amps 201 and 202. The non-inverting input of the op-amps 201 and 202 are connected to a constant common-mode (CM) voltage $V_{cm}$. The $V_{cm}$ signal maintains the input common-mode at a constant level to reduce the variation mentioned above. However, this conventional solution has at least two drawbacks. A first drawback is the use of two op-amps 201 and 202 that results in at least 3 dB additional noise compared to use of the single op-amp 101 of FIG. 1. A second drawback of this architecture is that by replacing one op-amp 101 with two op-amps 201 and 202, the total power and area consumption of the chip is larger.

FIG. 3 is a circuit of another conventional solution to the variation described above. A circuit 300 includes an input common-mode node that is sensed by DAC 302. The detected common-mode at the DAC 302 input is compensated by outputting signals to op-amp 301 from current sources embedded inside the DAC 302. One drawback of the circuit 300 is additional noise introduced by digital-to-analog converter (DAC) 302.

Shortcomings mentioned here are only representative and are included simply to highlight that a need exists for improved electrical components, particularly for operational amplifiers (or "op-amps") employed in consumer-level devices, such as mobile phones. Embodiments described herein address certain shortcomings but not necessarily each and every one described here or known in the art. Furthermore, embodiments described herein may present other benefits than, and be used in other applications than, those of the shortcomings described above.

SUMMARY

A dynamic common reference input (CMRI) signal may be provided to an op-amp in an amplifier system to improve operation of the amplifier system, a circuit coupled to the input of the amplifier system, and/or a circuit coupled to an output of the amplifier system. The improvement may reduce the common mode ripple of a fully-differential op-amp such that no noise or minimal noise is added to the amplifier system. Furthermore, the use of a dynamic CMRI signal adds little power consumption and area cost compared to the example prior art solutions described above. An amplifier system with the dynamic CMRI may be used in amplifier systems with multiple input signals. The dynamic CMRI voltage signal may be generated by a dynamic CMRI generation block configured to dynamically generate the CMRI voltage for the first operational amplifier. One example of a dynamic CMRI generation block is a circuit functioning as a signal dependent common-mode generator (SDCG). A dynamic CMRI generation block may also be software executing on digital logic circuit coupled to a digital-to-analog converter (DAC) for generating the dynamic CMRI voltage signal.

One example amplifier system is a fully-differential amplifier system having two system input nodes and two system output nodes. Such an amplifier system may include an operational amplifier (sometimes referred to as a "primary op-amp") with a common-mode reference input (CMRI), wherein the operational amplifier comprises two amplifier input nodes coupled to the two system input nodes and two amplifier output nodes coupled to the two system output nodes. The first operational amplifier is configured to adjust a common mode component of the output signal to approximately equal a dynamic CMRI signal, such as a voltage signal, received at its common-mode reference input (CMRI). Impedances, such as resistor or varistors, may be coupled between the two system input nodes and the two amplifier input nodes as input impedances. Impedances may also be coupled between the two system output nodes and the two amplifier input nodes as feedback impedances. A signal dependent common-mode generator (SDCG) coupled between the two input nodes and the CMRI may be configured to generate a dynamic CMRI signal such that a common-mode component of the two amplifier input nodes is made approximately independent of the two input signals received at the two system input nodes. The SDCG is one example circuit for generating the dynamic CMRI signal described above for improving the operation of the amplifier system. Although example SDGCs are described as operating with the primary op-amp of the amplifier system, the SDGC may be used in an amplifier system with multiple op-amps, wherein the multiple op-amps operate as the "primary op-amp."

The SDCG may include an operational amplifier (or "op-amp") configured to generate the dynamic CMRI signal. One example SDCG may include an op-amp, two input impedances coupled between an input node of op-amp and the two system input nodes, and two feedback impedances coupled between the input node of the op-amp and an output of the op-amp. The input and feedback impedances of the SDCG may be set at a ratio of the impedances coupled to the primary operational amplifier of the amplifier system. In some embodiments, the SDCG impedances may be between approximately 8 and 20 times higher than the impedances around the primary op-amp. In some embodiments, the SDCG impedances may be variable impedances, such as varistors, that are adjusted during operation of the amplifier system to control the CMRI signal provided to the primary op-amp such that a common-mode component of the primary op-amp inputs is made approximately independent of the inputs to the amplifier system. In some embodiments, the variable impedances may be adjusted based, in part or in whole, on a combination of operating condition and desired quality for the amplifier system.

The dynamic CMRI signal described herein may be used to improve amplifier system. One example amplifier system that may benefit from the dynamic CMRI signal is a class-D amplifier. The primary op-amp of the amplifier system described above may be a first integrator of a class-D amplifier. A class-D amplifier is an amplifier that uses transistors as switches modulating between two discrete states to amplify signals, such as audio signals. Class-D amplifiers may be used in mobile phones, hearing aids, powered speakers, home theatre equipment, musical instrument amplifiers, and other amplifier systems. The class-D amplifier may also include, for example, a second integrator coupled to the first integrator, a pulse width modulation (PWM) modulator coupled to the second integrator, and an H-bridge driver coupled to the PWM modulator. In some embodiments, input nodes of the class-D amplifier may be coupled to an output of the PWM modulator.

Electronic devices incorporating amplifier systems having a dynamic CMRI signal described above may benefit from improved performance, such as reduced common-mode ripple, in components of integrated circuits in the electronic devices. The integrated circuits may include an amplifier systems integrated with or operating in cooperation with, for example, an analog-to-digital converter (ADC), a digital-to-analog converter (DAC), and/or a coder/decoder (CODER). For example, a memory may supply digital audio data to a CODEC that decodes audio from the digital audio data, and the CODEC may supply the decoded audio to a DAC and subsequently to an amplifier system having a dynamically-generated CMRI signal. The output of the amplifier system may be headphones or a speaker. Such an amplifier system may be used in electronic devices with audio outputs, such as music players, CD players, DVD players, Blu-ray players, headphones, portable speakers, headsets, mobile phones, tablet computers, personal computers, set-top boxes, digital video recorder (DVR) boxes, home theatre receivers, infotainment systems, automobile audio systems, and the like. The CODEC, DAC, and amplifier system may be integrated into an integrated circuit (IC) such as an audio controller. Although audio functionality is described herein, the amplifier systems described herein may be applied to the amplification of any signal, wherein amplification may include either an increase or decrease in magnitude of an input signal.

The foregoing has outlined rather broadly certain features and technical advantages of embodiments of the present invention in order that the detailed description that follows may be better understood. Additional features and advantages will be described hereinafter that form the subject of the claims of the invention. It should be appreciated by those having ordinary skill in the art that the conception and specific embodiment disclosed may be readily utilized as a basis for modifying or designing other structures for carrying out the same or similar purposes. It should also be realized by those having ordinary skill in the art that such equivalent constructions do not depart from the spirit and scope of the invention as set forth in the appended claims. Additional features will be better understood from the following description when considered in connection with the accompanying figures. It is to be expressly understood, however, that each of the figures is provided for the purpose of illustration and description only and is not intended to limit the present invention.

BRIEF DESCRIPTION OF THE DRAWINGS

For a more complete understanding of the disclosed system and methods, reference is now made to the following descriptions taken in conjunction with the accompanying drawings.

DETAILED DESCRIPTION

Embodiments described below provide the processing of signals to generate a common mode reference input (CMRI) signal for an operational amplifier. The CMRI signal may be dynamically-generated such that the CMRI signal is adjusted to maintain a common-mode component of two amplifier input nodes as approximately independent of two input signals received at the amplifier system. The dynamic CMRI signal may reduce the ripple amplitude at the input common mode of an amplifier system. One technique for generating the CMRI signal is with a circuit referred to as a signal-dependent common-mode generator (SDCG). However, a dynamic CMRI signal may be generated from other circuits than the examples described below.

Figure 1:
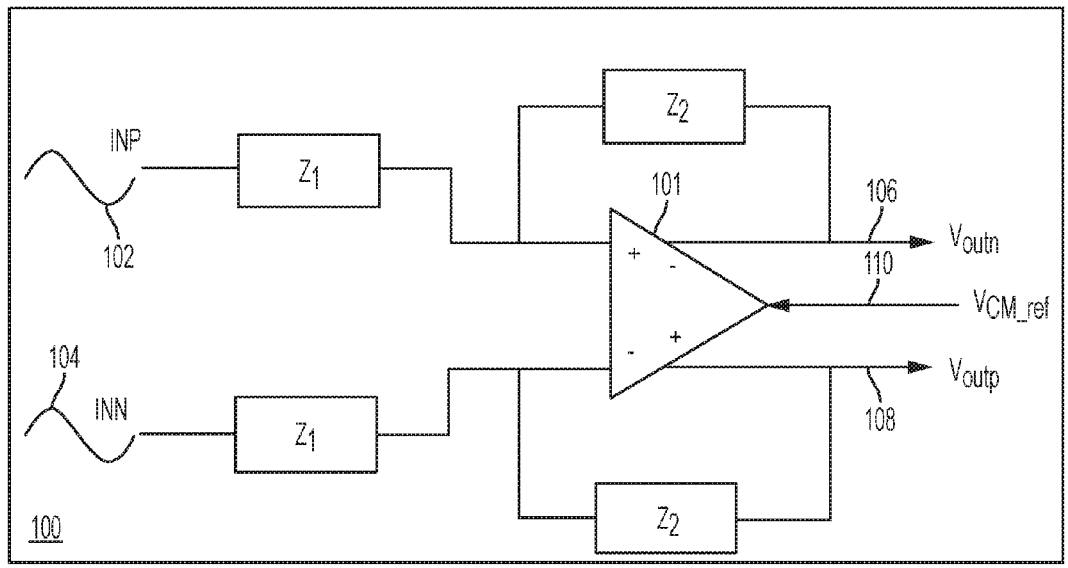
FIG. 1 is an amplifier system according to one example in the prior art.
Figure 2:
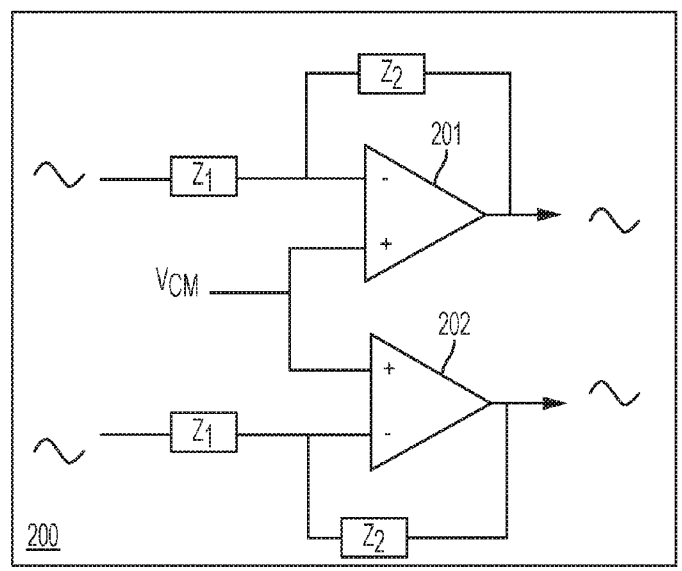
FIG. 2 is an amplifier system according to another example in the prior art.
Figure 3:
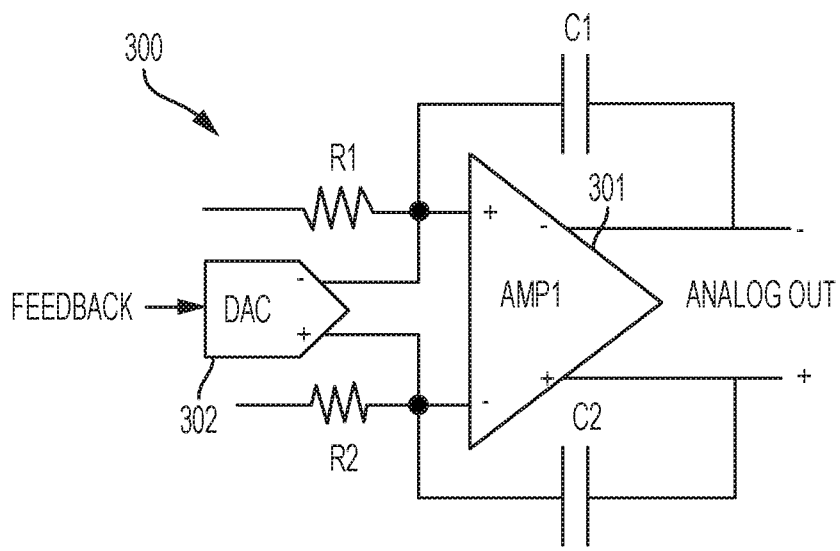
FIG. 3 is an amplifier system according to a further example in the prior art.
Figure 4:
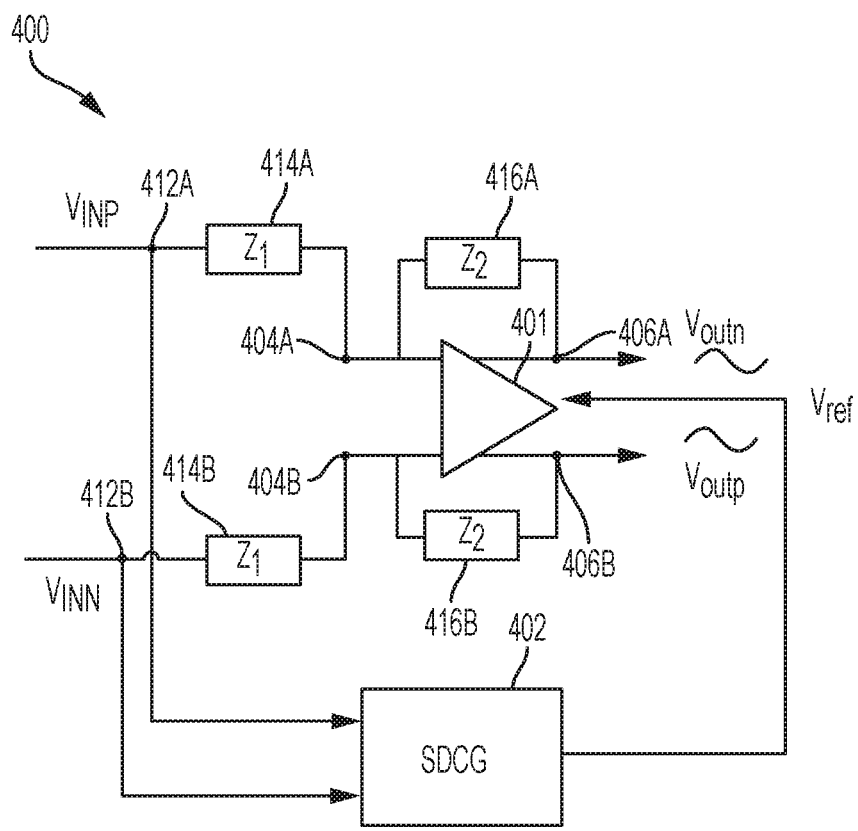
FIG. 4 is an amplifier system with a dynamic common-mode reference input (CMRI) signal generated by a signal-dependent common-mode generator (SDCG) according to some embodiments of the disclosure.

FIG. 4 is an amplifier system with a dynamic common-mode reference input (CMRI) signal generated by a signal-dependent common-mode generator (SDCG) according to some embodiments of the disclosure. A signal-dependent common-mode generator (SDCG) 402 of an amplifier system 400 is coupled to a CMRI input of operational amplifier ("op-amp") 401. The op-amp 401 may be a fully-differential operational amplifier. The SDCG 402 may generate a dynamic CMRI signal to control the op-amp 401. For example, the SDGC 402 may shift signal variation from the input nodes 404A and 404B of the op-amp 401 to the output nodes 406A and 406B of the op-amp 401. The SDGC 402 may generate a changing common mode at its output, which is approximately proportional to, or otherwise related to, the common-mode signal at the input nodes 404A and 404B of the op-amp 401 if the SDGC unit 402 was not present. This changing signal provided by the SDGC 402 is fed back to the op-amp 401 and controls the reference of the output common-mode feedback circuit of the op-amp 401. The output common mode of the op-amp 401, which tracks the reference common mode, may have a ripple with the same amplitude as the common-mode ripple at the input nodes 404A and 404B of the op-amp 401 when the SDCG 402 was not present. Thus, the ripple that was seen on the input common-mode node of the amplifier is now shifted to the output common mode and the input common mode remains constant.

Other components of the amplifier system 400 may include system input nodes 412A and 412B for input signals $V_{INP}$ and $V_{INN}$, respectively. The input nodes 412A and 412B may be coupled to the input nodes 404A and 404B of the op-amp 401 through input impedances 414A and 414B, respectively. Additional feedback impedances 416A and 416B may be coupled between the input nodes 404A and 404B of the op-amp 401 and the output nodes 406A and 406B of the op-amp 401.

Figure 5:
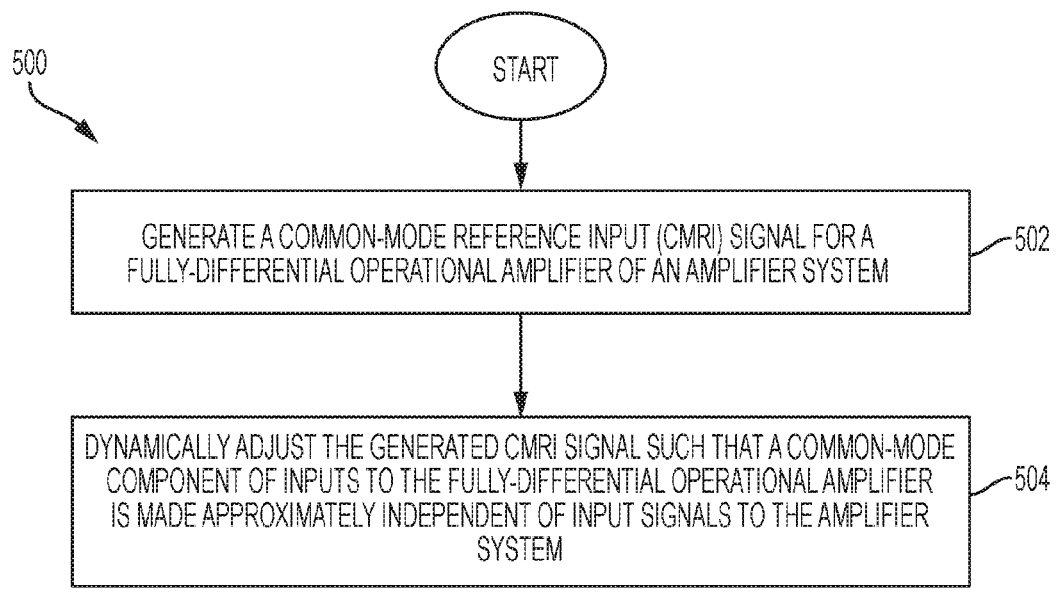
FIG. 5 is a flow chart illustrating an example method for operating an amplifier system with a dynamic CMRI signal according to one embodiment of the disclosure.

An example operation of the SDGC 402 is shown in FIG. 5. FIG. 5 is a flow chart illustrating an example method for operating an amplifier system with a dynamic CMRI signal according to some embodiment of the disclosure. A method 500 may begin at block 502 with generating a common-mode reference input (CMRI) signal for a fully-differential operational amplifier of an amplifier system. At block 504, the CMRI signal may be dynamically adjusted such that a common-mode component of inputs to the fully-differential operational amplifier is made approximately independent of input signals to the amplifier system. That is, the common-mode at input nodes 404A and 404B of the op-amp 401 may be made respectively independent from the input nodes 412A and 414B of the amplifier system 400. The CMRI signal may be generated and adjusted by circuitry within the SDGC 402. Alternatively, the CMRI signal may be generated and adjusted by logic circuitry configured to execute firmware and/or software to control generation of the CMRI signal. For example, the SDGC 402 may include a signal generator, such as a waveform generator or a DC voltage source, and logic circuitry or other control circuitry to control an output level of the signal generator to obtain a desired CMRI signal.

Figure 6A:
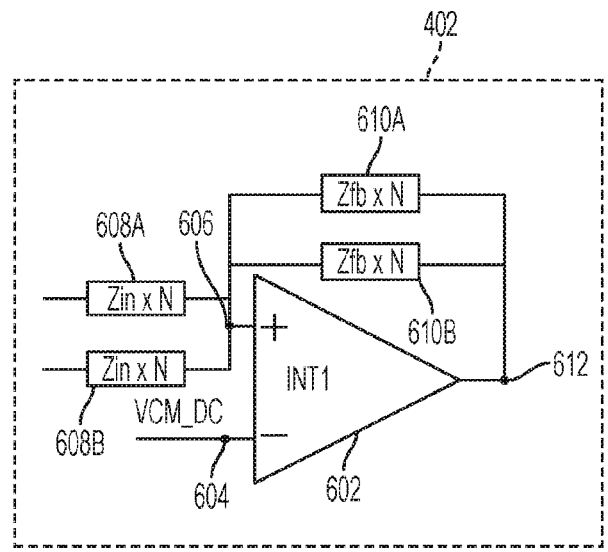
FIG. 6A is an example signal-dependent common-mode generator (SDCG) using an operational amplifier according to some embodiments of the disclosure.

One example circuit for the SDGC 402 is shown in FIG. 6A. FIG. 6A is an example signal-dependent common-mode generator (SDCG) using an operational amplifier according to some embodiments of the disclosure. The SDGC 402 may include an operational amplifier ("op-amp") 602. The op-amp 602 may receive a DC common-mode voltage signal $V_{CN\_DC}$ at non-inverting input node 604. The op-amp 602 may receive input signals at inverting input node 606. The input signals received at input node 606 may be, for example, the input signals $V_{INP}$ and $V_{INN}$ at system input nodes 412A and 412B. Input impedances 608A and 608B may be coupled between the input signals and the inverting input node 606. Feedback impedances 610A and 610B may be coupled between an output node 612 and the inverting input node 606. The output node 612 may be coupled to a CMRI input of the op-amp 401 of the amplifier system 400. In some embodiments, the input impedances 608A and 608B may be equal to approximately Zin*N, or an integer multiple (e.g., N) of the input impedances 414A and 414B of the op-amp 401, and the feedback impedances 610A and 610B may be equal to approximately Zfb*N, or an integer multiple of the feedback impedances 416A and 416B of the op-amp 401. Zin is an input impedance of the amplifier 401 (e.g., based on Z1), and Zfb is a feedback impedance around amplifier 401 (e.g., based on Z2).

Figure 6B:
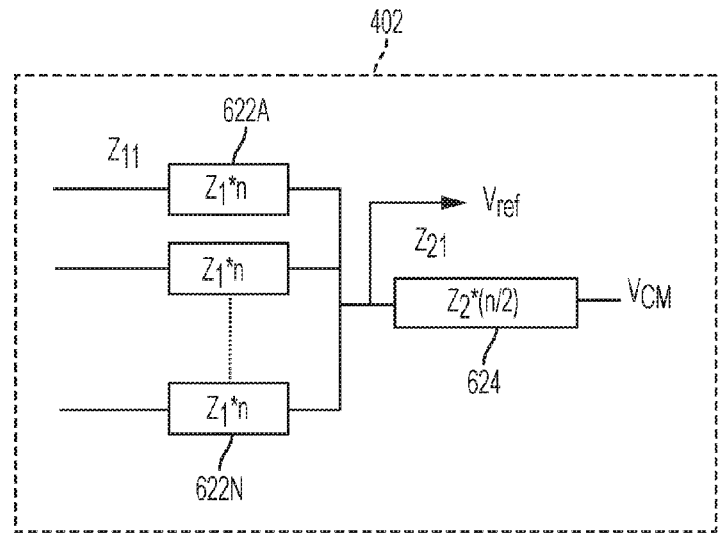
FIG. 6B is an example signal-dependent common-mode generator (SDCG) using impedances according to some embodiments of the disclosure.

Another example circuit for the SDGC 402 is shown in FIG. 6B. FIG. 6B is an example signal-dependent common-mode generator (SDCG) using impedances according to some embodiments of the disclosure. The SDGC 402 may include impedances 622A-N collectively operating as an impedance $Z_{11}$ and impedance 624 operating as an impedance $Z_{21}$. In some embodiments, the impedances 622A-N may each have an impedance of Z1*N, or an integer multiple (e.g., N) of the input impedances 414A and 414B of the op-amp 401, and the impedance 624 may have an impedance equal to approximately Z2*(N/2), or equal to approximately a ratio of the feedback impedance 416A and 416B of the op-amp 401. Z1 may be an input impedance of, e.g., amplifier 401, and Z2 may be a feedback impedance of, e.g., amplifier 401.

Figure 7:
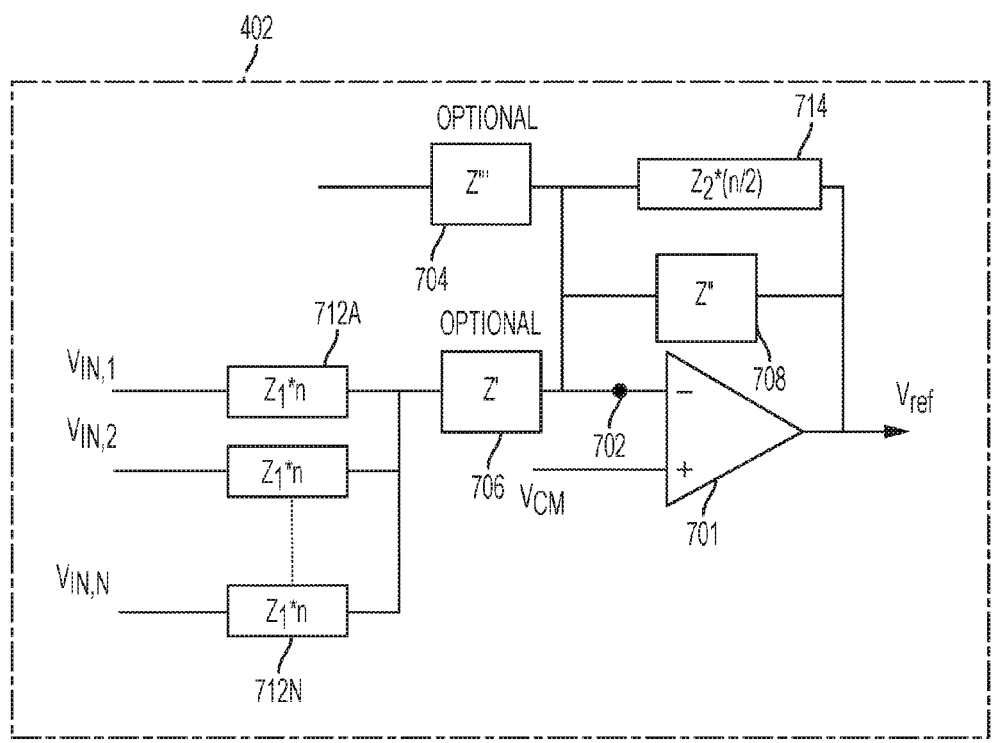
FIG. 7 is an example signal-dependent common-mode generator (SDCG) for generating a dynamic CMRI signal according to some embodiments of the disclosure.

Another example embodiment of the SDCG 402 is shown in FIG. 7. FIG. 7 is an example signal-dependent common-mode generator (SDCG) for generating a dynamic CMRI signal according to some embodiments of the disclosure. The SDGC 402 of FIG. 7 provides for connection of multiple signal inputs $V_{IN,1}$-$V_{IN,N}$. The SDGC 402 may include a differential-input, single-ended operational amplifier ("op-amp") 701. The op-amp 701 is used in a feedback structure having impedances $Z_{11}$ and $Z_{21}$ that operate as feedback impedances. The impedance $Z_{11}$ may be composed of input impedances 712A-N. The impedance $Z_{21}$ may be composed of input impedance 714. The input common mode of the op-amp 701 is set by a constant voltage $V_{CM}$. The impedances for the example SDCG 402 may be set according to the equation below:

$$Z_{11} * Z_{21} = Z_1 * Z_2$$

Optional additional impedances 704, 706, and 708 may be coupled to a non-inverting input of the op-amp 701. The SDGC 402 of the above examples have low power consumption and area cost and also provide a reduction in input common-mode ripple reduction at the amplifier system input nodes.

An operational amplifier with reduced common-mode ripple resulting from a dynamic CMRI signal may be used in any circuit implementing a fully-differential operational amplifier system. One example circuit is a class-D audio amplifier system. Class-D audio amplifiers are used in many applications, including audio amplifiers. Their low power consumption and high efficiency have made them one of the more favorable architectures in audio design. The class-D amplifiers may be incorporated into an integrated circuit (IC) with other functionality as an audio controller. Such an audio controller may be used in mobile devices, such as mobile phones. In some embodiments, the audio controller may include functionality such as digital-to-analog conversion and audio decoding along with a class-D amplifier system or other amplifier system. To improve the linearity of a class-D audio amplifier, the class-D amplifier may be placed in a high-gain feedback loop having one or more integrators. The high gain results in a more linear class-D amplifier. A simple closed loop class-D amplifier with a cascade of integrators with a feedforward (CIFF) topology is shown in FIG. 8.

Figure 8:
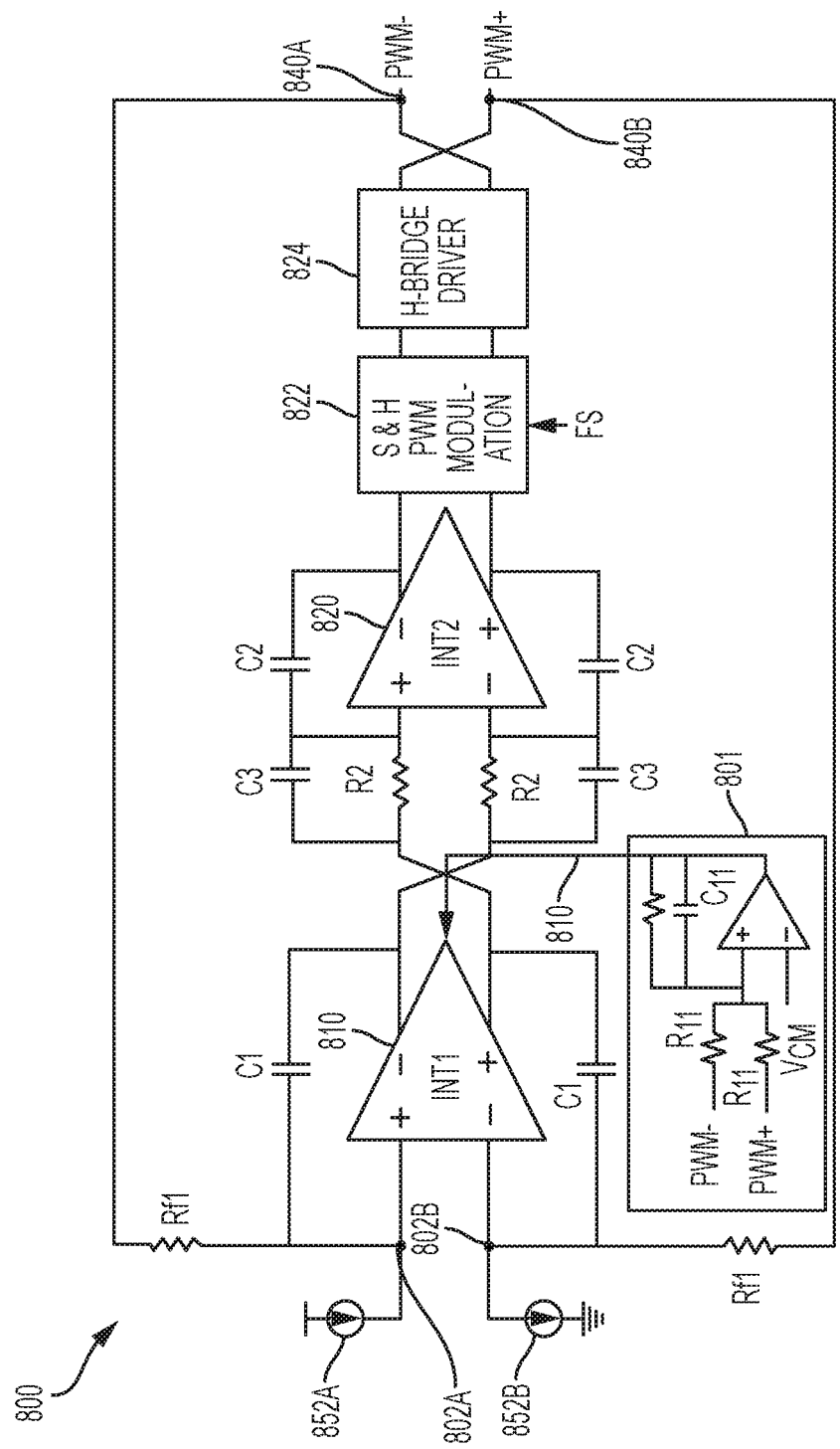
FIG. 8 is an example class-D amplifier system with a cascade of integrators with a feedforward (CIFF) topology with current source input and a dynamic CMRI signal according to some embodiments of the disclosure.

FIG. 8 is an example class-D amplifier system with a cascade of integrators with a feedforward (CIFF) topology with current source input and a dynamic CMRI signal according to some embodiments of the disclosure. Class-D amplifier system 800 may include input nodes 802A and 802B coupled to the input nodes of integrator 810. The input nodes 802A-B may have a large common mode ripple that produces undesirable effects in the class-D amplifier 800. This ripple affects the performance of the integrator 810, and also the preceding block that is connected to the class-D amplifier. An SDCG 801 may produce a dynamic CMRI signal applied to the integrator 810. An input to the SDCG 801 may be based on the output of the class-D amplifier from output nodes 840A and 840B. The input common-mode ripple may be reduced, and thus the performance of the integrator 810 and the preceding unit improved. The common-mode ripple at the input of the integrator 810 is shifted to the output of integrator 810. In some embodiments, the resistor R11 and the capacitor C11 may be chosen such that:

$$R_{11}*C_{11}=R_{f1}*C_1.$$

where Rf1 may be a resistance value between an output of the amplifier system and an input of the first stage, and C1 may be a capacitance value between an input and an output of the first amplifier stage.

The output of the first integrator 810 may be coupled to a second integrator 820. The output of the second integrator 820 may be coupled to sample and hold, pulse width modulation (S&H PWM) modulation block 822, and subsequently to H-bridge driver 824 to generate the amplifier system output at the output nodes 840A and 840B.

Figure 9:
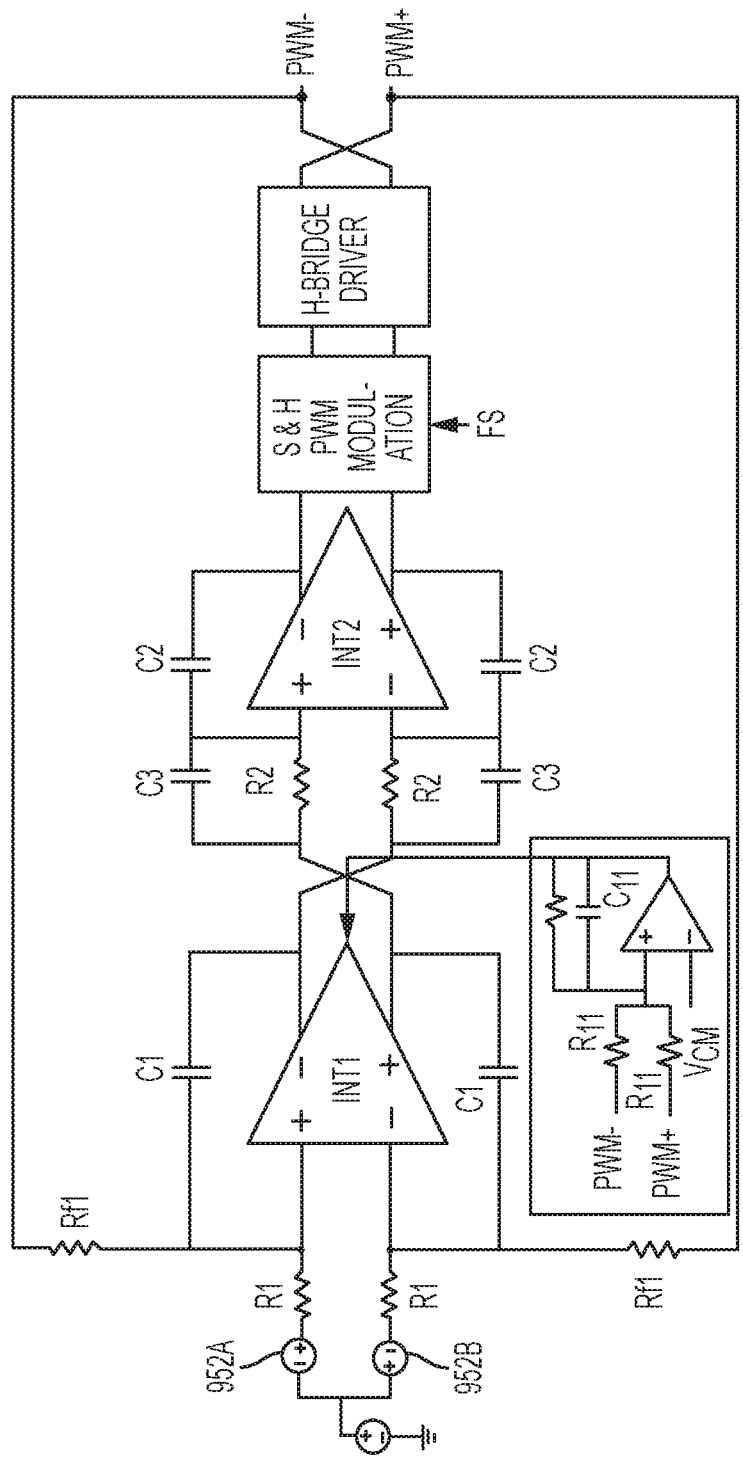
FIG. 9 is an example class-D amplifier system with a cascade of integrators with a feedforward (CIFF) topology with voltage source input and a dynamic CMRI signal according to some embodiments of the disclosure.

Another embodiment for the SDCG block in a CIFF structure is shown in FIG. 9. FIG. 9 is an example class-D amplifier system with a cascade of integrators with a feedforward (CIFF) topology with voltage source input and a dynamic CMRI signal according to some embodiments of the disclosure. FIG. 9 shows that the SDCG can be applied to a CIFF class-D amplifier with voltage source inputs 952A and 952B, instead of the current source inputs 852A and 852B shown in FIG. 8.

Figure 10:
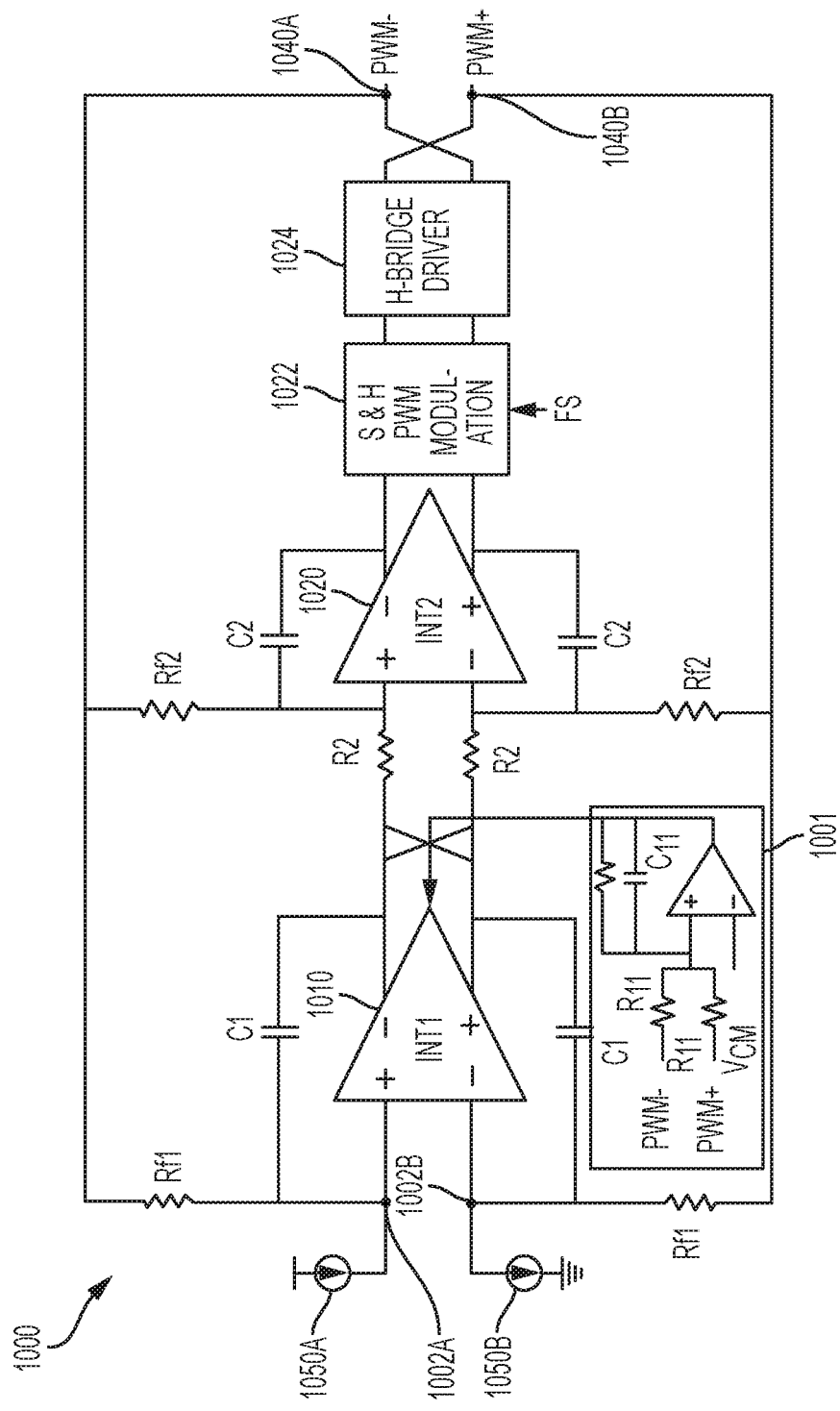
FIG. 10 is an example class-D amplifier system with a cascade of integrators in feedback (CIFB) topology with current source input and a dynamic CMRI signal according to some embodiments of the disclosure.

Another example usage of the SDCG block is in a cascade of integrators in a feedback (CIFB) topology class-D amplifier system. One example embodiment of such an amplifier system is shown in FIG. 10. FIG. 10 is an example class-D amplifier system with a cascade of integrators in feedback (CIFB) topology with current source input and a dynamic CMRI signal according to some embodiments of the disclosure. Class-D amplifier system 1000 may include input nodes 1002A and 1002B directly coupled to the input nodes of first integrator 1010. An SDCG 1001 may produce a dynamic CMRI signal applied to the first integrator 1010. An input to the SDCG 1001 may be the output of the class-D amplifier from output nodes 1040A and 1040B. The output of the first integrator 1010 may be coupled to a second integrator 1020. The output of the second integrator 1020 may be coupled to S&H PWM modulation block 1022, and subsequently to H-bridge driver 1024 to generate the amplifier system output at the output nodes 1040A and 1040B. In the CIFB architecture of FIG. 10, unlike the CIFF architecture of FIG. 9, there is more than one feedback from the output nodes 1040A and 1040B of the amplifier system 1000. Feedback is provided through resistors Rf1 to the first integrator 1010 and through resistors Rf2 to the second integrator 1020. Similar to the CIFF architecture of FIG. 9, a large ripple is seen at the input nodes 1002A and 1002B. The SDCG block 1001 may improve performance of the amplifier system 1000 by reducing the impact of this large ripple. In some embodiments, resistances and capacitances throughout the fully-differential amplifier system may be adjusted at start-up or during operation of the amplifier system. For example, the resistor Rf1 can be reduced to reduce the total output noise. The capacitance C1 may then be adjusted, such as by increasing the capacitance C1, to maintain amplifier stability and headroom.

Figure 11:
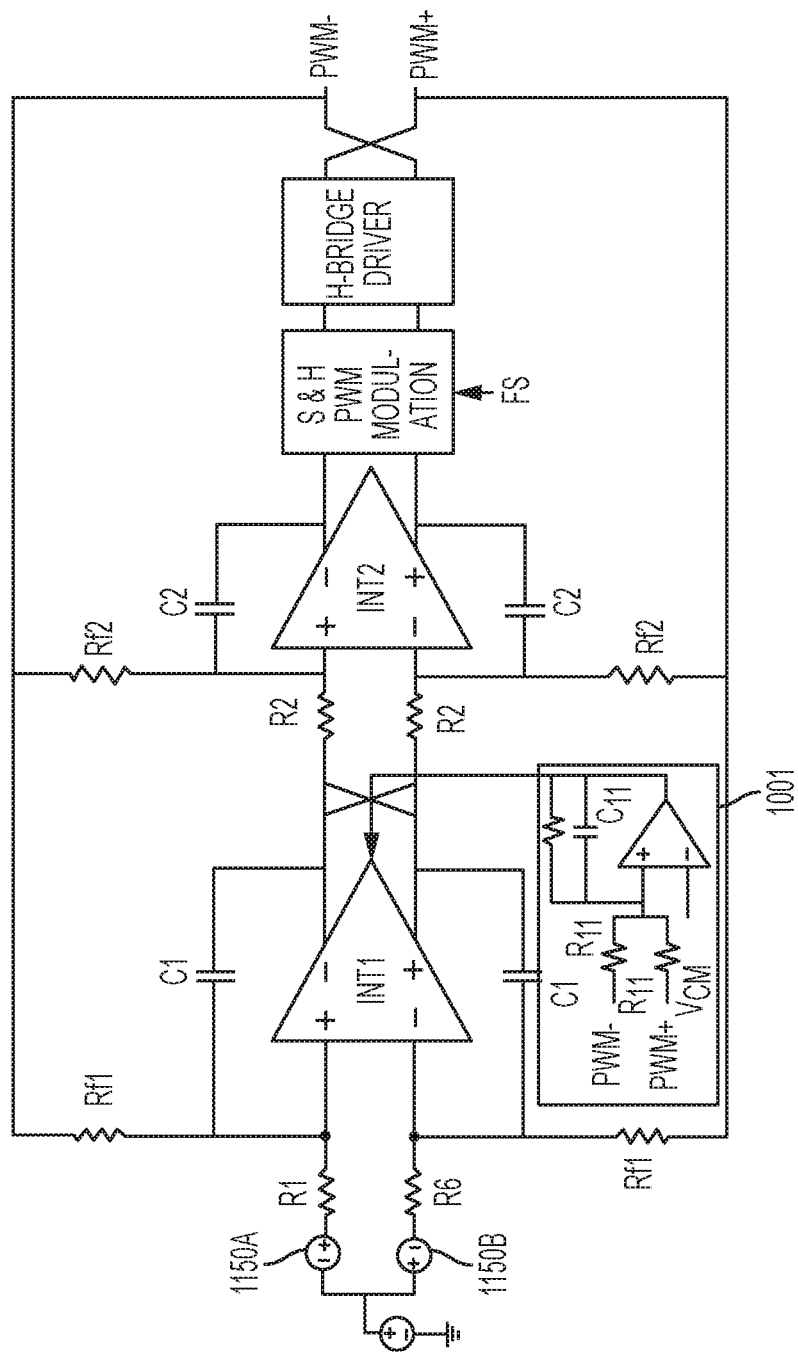
FIG. 11 is an example class-D amplifier system with a cascade of integrators in feedback (CIFB) topology with voltage source input and a dynamic CMRI signal according to some embodiments of the disclosure.

FIG. 10 illustrates an embodiment of a CIFB class-D amplifier system with current source inputs 1050A and 1050B. In other embodiments, the CIFB architecture may be used with voltage source inputs 1150A and 1150B. One example embodiment with voltage source inputs is shown in FIG. 11. FIG. 11 is an example class-D amplifier system with a cascade of integrators in feedback (CIFB) topology with voltage source input and a dynamic CMRI signal according to some embodiments of the disclosure.

The schematic flow chart diagram of FIG. 5 is generally set forth as a logical flow chart diagram. Likewise, other operations for the circuitry are described without flow charts herein as sequences of ordered steps. The depicted order, labeled steps, and described operations are indicative of aspects of methods of the invention. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagram, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

The operations described above as performed by a controller may be performed by any circuit configured to perform the described operations. Such a circuit may be an integrated circuit (IC) constructed on a semiconductor substrate and include logic circuitry, such as transistors configured as logic gates, and memory circuitry, such as transistors and capacitors configured as dynamic random access memory (DRAM), electronically programmable read-only memory (EPROM), or other memory devices. The logic circuitry may be configured through hard-wire connections or through programming by instructions contained in firmware. Further, the logic circuitry may be configured as a general purpose processor capable of executing instructions contained in software. In some embodiments, the integrated circuit (IC) that is the controller may include other functionality. For example, the controller IC may include an audio coder/decoder (CODEC) along with circuitry for performing the functions described herein. Such an IC is one example of an audio controller. Other audio functionality may be additionally or alternatively integrated with the IC circuitry described herein to form an audio controller.

If implemented in firmware and/or software, functions described above may be stored as one or more instructions or code on a computer-readable medium. Examples include non-transitory computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise random access memory (RAM), read-only memory (ROM), electrically-erasable programmable read-only memory (EEPROM), compact disc read-only memory (CD-ROM) or other optical disk storage, magnetic disk storage or other magnetic storage devices, or any other medium that can be used to store desired program code in the form of instructions or data structures and that can be accessed by a computer. Disk and disc includes compact discs (CD), laser discs, optical discs, digital versatile discs (DVD), floppy disks and Blu-ray discs. Generally, disks reproduce data magnetically, and discs reproduce data optically. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and certain representative advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. For example, although analog-to-digital converters (ADCs) are described throughout the detailed description, aspects of the invention may be applied to the design of other converters, such as digital-to-analog converters (DACs) and digital-to-digital converters, or other circuitry and components based on delta-sigma modulation. As another example, although audio controllers with logic circuitry are described, the functionality of the logic circuitry may be implemented in analog circuitry and/or digital circuitry. Examples of such digital circuitry include digital signal processors (DSPs), graphics processing units (GPUs), and central processing units (CPUs). As another example, although processing of audio data is described, other data may be processed through the filters and other circuitry described above. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. A fully-differential amplifier system having two system input nodes and two system output nodes, comprising:
    a first operational amplifier with a common-mode reference input (CMRI), wherein the first operational amplifier comprises two amplifier input nodes coupled to the two system input nodes and two amplifier output nodes coupled to the two system output nodes, and wherein the first operational amplifier is configured to adjust a common mode component of the output signal to approximately equal a CMRI voltage received at the CMRI;
    and
    a dynamic CMRI generation block configured to dynamically generate the CMRI voltage for the first operational amplifier, wherein the dynamic CMRI generation block is configured to generate the CMRI voltage such that a common-mode component of the two amplifier input nodes is made approximately independent of two input signals received at the two system input nodes.

2. The fully-differential amplifier system of claim 1, further comprising:
    two input impedances respectively coupled between the two system input nodes and the two amplifier input nodes; and
    two feedback impedances respectively coupled between the two system output nodes and the two amplifier input nodes,
    wherein the dynamic CMRI generation block comprises a signal-dependent common-mode generator (SDCG) coupled between the two system input nodes and the CMRI.

3. The fully-differential amplifier system of claim 2, wherein the SDCG comprises:
    a second operational amplifier;
    two input impedances coupled between an input node of the second operational amplifier and the two system input nodes; and
    two feedback impedances coupled between the input node of the second operational amplifier and an output of the second operational amplifier.

4. The fully-differential amplifier system of claim 3, wherein the two input impedances of the SDCG have impedance values equal to a scaled value of an impedance value of the two input impedances of the amplifier system, and wherein the two feedback impedances of the SDCG have impedance values equal to a scaled value of an impedance value of the two feedback impedances of the amplifier system.

5. The fully-differential amplifier system of claim 4, wherein the scaled values are between approximately 8 and 20 times higher.

6. The fully-differential amplifier system of claim 4, wherein the two input impedances of the SDCG, the two feedback impedances of the SDCG, the two input impedances of the amplifier system, and the two feedback impedances of the amplifier system are each variable impedances, and wherein the variable impedances are adjusted during operation of the fully-differential amplifier system.

7. The fully-differential amplifier system of claim 6, wherein the variable impedances are adjusted during operation of the fully-differential amplifier system based, at least in part, on a combination of operating condition and desired quality.

8. The fully-differential amplifier system of claim 2, wherein the SDCG comprises:

a first impedance coupled to the two system input nodes and to the first operational amplifier and having an impedance value equal to a scaled value of an impedance value of the two input impedances; and a second impedance coupled to the first impedance and to the first operational amplifier and having an impedance value equal to a scaled value of an impedance value of the two feedback impedances.

9. The fully-differential amplifier system of claim 2, wherein each of the two input impedances comprises a plurality of impedances coupled to a plurality of input signals.

10. The fully-differential amplifier system of claim 1, wherein the dynamic CMRI generation block is configured such that a common-mode of the two amplifier output nodes is dependent, at least in part, on the two input signals received at the two amplifier input nodes.

11. The fully-differential amplifier system of claim 1, wherein the fully-differential amplifier system is part of a class-D amplifier system, and wherein the first operational amplifier is a first integrator of the class-D amplifier system.

12. The fully-differential amplifier system of claim 11, further comprising:
a second integrator coupled to the first integrator;
a pulse width modulation (PWM) modulator coupled to the second integrator; and
a H-bridge driver coupled to the PWM modulator,
wherein the two system input nodes are coupled to an output of the PWM modulator.

13. The fully-differential amplifier system of claim 1, further comprising a voltage-mode digital-to-analog converter (DAC) coupled to the two system input nodes.

14. The fully-differential amplifier system of claim 1, further comprising a current-mode digital-to-analog converter (DAC) coupled to the two amplifier input nodes.

15. A method, comprising:
generating a common-mode reference input (CMRI) signal for a fully-differential operational amplifier system having two system input nodes coupled to two amplifier input nodes of a first operational amplifier,
wherein the generated CMRI signal is dynamically adjusted such that a common-mode component of the two amplifier input nodes is made approximately independent of two input signals received at the two system input nodes.

16. The method of claim 15, wherein the step of generating the CMRI signal comprises generating the CMRI with an operational amplifier.

17. The method of claim 16, wherein the step of generating the CMRI signal comprises adjusting impedances coupled to the operational amplifier.

18. The method of claim 15, wherein the step of generating the CMRI signal comprises generating the CMRI with a plurality of impedances.

19. The method of claim 15, wherein the generated CMRI signal is generated such that a common-mode of amplifier output nodes of the first operational amplifier is dependent, at least in part, on two input signals received at the two amplifier input nodes.

20. The method of claim 15, further comprising amplifying an input signal received at the two system input nodes with the first operational amplifier to generate an output signal at two system output nodes.

21. An apparatus, comprising:
a fully-differential amplifier system having two system input nodes and two system output nodes comprising:

a first operational amplifier with a common-mode reference input (CMRI), wherein the first operational amplifier comprises two amplifier input nodes coupled to the two system input nodes and two amplifier output nodes coupled to the two system output nodes, and wherein the first operational amplifier is configured to adjust a common mode component of the output signal to approximately equal a CMRI voltage received at the CMRI;
two input impedances respectively coupled between the two system input nodes and the two amplifier input nodes; and
two feedback impedances respectively coupled between the two system output nodes and the two amplifier input nodes; and
a controller comprising:
a signal-dependent common-mode generator (SDCG) coupled between the two system input nodes and the CMRI, wherein the SDCG is configured to generate the CMRI voltage such that a common-mode component of the two amplifier input nodes is made approximately independent of two input signals received at the two system input nodes.

22. The apparatus of claim 21, further comprising:
a coder/decoder (CODEC);
a digital-to-analog converter (DAC) coupled to the CODEC,
wherein an output of the DAC is coupled to the two system input nodes of the fully-differential amplifier system.

23. The apparatus of claim 22, wherein the controller is an audio controller, and wherein the fully-differential amplifier system and the audio controller are coupled together as part of an integrated circuit (IC).

24. The apparatus of claim 21, wherein the SDCG comprises:
a second operational amplifier;
two input impedances coupled between an input node of the second operational amplifier and the two system input nodes; and
two feedback impedances coupled between the input node of the second operational amplifier and an output of the second operational amplifier.

25. The apparatus of claim 24, wherein the two input impedances of the SDCG have impedance values equal to a scaled value of an impedance value of the two input impedances of the amplifier system, and wherein the two feedback impedances of the SDCG have impedance values equal to a scaled value of an impedance value of the two feedback impedances of the amplifier system.

26. The apparatus of claim 21, the SDCG comprises:
a first impedance coupled to the two system input nodes and to the first operational amplifier and having an impedance value equal to a scaled value of an impedance value of the two input impedances; and
a second impedance coupled to the first impedance and to the first operational amplifier and having an impedance value equal to a scaled value of an impedance value of the two feedback impedances.

27. The apparatus of claim 21, wherein the SDCG is configured such that a common-mode of the two amplifier output nodes is dependent, at least in part, on the two input signals received at the two amplifier input nodes.

28. The apparatus of claim 21, wherein the fully-differential amplifier system is part of a class-D amplifier, and wherein the first operational amplifier is a first integrator of the class-D amplifier.

29. The apparatus of claim 28, wherein the class-D amplifier system further comprises:
   a second integrator coupled to the first integrator;
   a pulse width modulation (PWM) modulator coupled to the second integrator; and
   a H-bridge driver coupled to the PWM modulator,
   wherein the two system input nodes are coupled to an output of the PWM modulator.

* * * * *